(12) United States Patent
Bleck et al.

(10) Patent No.: US 6,746,565 B1
(45) Date of Patent: *Jun. 8, 2004

(54) SEMICONDUCTOR PROCESSOR WITH WAFER FACE PROTECTION

(75) Inventors: Martin C. Bleck, Kalispell, MT (US); Timothy J. Reardon, Kalispell, MT (US); Eric J. Bergman, Kalispell, MT (US)

(73) Assignee: Semitool, Inc., Kalispell, MT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/478,870

(22) Filed: Jan. 7, 2000

Related U.S. Application Data

(60) Continuation of application No. 09/046,808, filed on Mar. 23, 1998, now Pat. No. 6,022,484, which is a division of application No. 08/516,175, filed on Aug. 17, 1995, now Pat. No. 5,762,751.

(51) Int. Cl.[7] .......................... C23F 1/00; H01L 21/306
(52) U.S. Cl. .......................... 156/345.14; 156/345.12; 451/41; 451/66
(58) Field of Search ................. 156/345; 451/285–289; 414/935; 216/57, 58, 73, 83, 67; 438/689, 704, 745; 118/500, 723 E, 725; 165/80.1

(56) References Cited

U.S. PATENT DOCUMENTS

| 2,751,345 A | 5/1956 | Osman | 204/297.05 |
| 3,307,869 A | * 3/1967 | Warfel | 294/64.1 |
| 3,509,036 A | 4/1970 | Igras et al. | 204/622 |
| 3,627,369 A | * 12/1971 | Nixon | 294/64.1 |

(List continued on next page.)

FOREIGN PATENT DOCUMENTS

| EP | 0 456 372 | | 3/1995 | |
| EP | 0747167 A | * | 11/1996 | |
| JP | 357128939 A | * | 8/1982 | H01L/21/68 |
| JP | 63-256326 | * | 10/1988 | |
| JP | 410135317 A | * | 5/1998 | H01L/21/68 |
| WO | WO 92/02948 | | 2/1992 | |

OTHER PUBLICATIONS

E.S. Hellman et al, "Molecular beam epitaxy of gallium arsenide using direct radiative substrate heating" J. Vac. Sci. Technol. B 4(2), Mar./Apr. 1986, pp. 574–577.*

W. Lougher et al, "Design of compression shrink–fit ceramic–steel wear ring assembly for chemical mechanical planarization" J. Vac. Sci. Technol. B 18(5), Sep./Oct. 2000, pp. 2597–2602.*

J.C. Wolfe et al, "Magnetically enhanced triode etching of large area silicon membranes in a molecular bromine plasma" J. Vac. Sci. Technol. B 10(6), Nov./Dec. 1992, pp. 2716–2719.*

Primary Examiner—Jeffrie R. Lund
Assistant Examiner—Rudy Zervigon
(74) Attorney, Agent, or Firm—Perkins Coie LLP

(57) ABSTRACT

A semiconductor processing station which utilizes a processing head and processing base which are complementary to enclose a processing chamber. The processing head shown has a rotor with two portions both of which rotate. The rotor has axial movable portions which include a piece holder. The piece holder supports a wafer or other semiconductor piece being processed. The piece holder can be axially extended and retracted relative to a thin membrane which acts as a cover to prevent chemicals from reaching the back side of the wafer during processing.

7 Claims, 6 Drawing Sheets

U.S. PATENT DOCUMENTS

| | | | |
|---|---|---|---|
| 3,747,282 A | * 7/1973 | Katzke | 451/388 |
| 3,824,176 A | 7/1974 | Crowe | 204/297.05 |
| 3,833,230 A | * 9/1974 | Noll | 279/3 |
| 3,960,623 A | 6/1976 | Ganthley | 558/373 |
| 4,032,804 A | * 6/1977 | Wagner | 310/328 |
| 4,270,316 A | * 6/1981 | Kramer et al. | 451/41 |
| 4,647,512 A | * 3/1987 | Venkataramanan et al. | 428/688 |
| 4,971,676 A | 11/1990 | Doue et al. | 118/503 |
| 5,078,852 A | 1/1992 | Yee et al. | 204/297.05 |
| 5,135,636 A | 8/1992 | Yee et al. | 205/96 |
| 5,144,407 A | 9/1992 | Wojnarowski et al. | 257/705 |
| 5,227,041 A | 7/1993 | Brogden et al. | 204/297.05 |
| 5,228,501 A | * 7/1993 | Tepman et al. | 165/80.1 |
| 5,235,995 A | * 8/1993 | Bergman et al. | 134/105 |
| 5,273,588 A | * 12/1993 | Foster et al. | 118/723 E |
| 5,314,574 A | * 5/1994 | Takahashi | 438/706 |
| 5,415,691 A | * 5/1995 | Fujiyama et al. | 118/52 |
| 5,421,893 A | * 6/1995 | Perlov | 118/725 |
| 5,423,716 A | * 6/1995 | Strasbaugh | 451/388 |
| 5,441,444 A | * 8/1995 | Nakajima | 451/289 |
| 5,472,592 A | 12/1995 | Lowery | 205/137 |
| 5,489,341 A | * 2/1996 | Bergman et al. | 134/26 |
| 5,492,566 A | * 2/1996 | Summitsch | 118/500 |
| 5,500,081 A | * 3/1996 | Bergman | 438/706 |
| 5,554,064 A | * 9/1996 | Breivogel et al. | 451/41 |
| 5,602,058 A | * 2/1997 | Ooizumi et al. | 156/286 |
| 5,641,375 A | 6/1997 | Nitescu et al. | 156/345.1 |
| 5,658,387 A | * 8/1997 | Reardon et al. | 118/323 |
| 5,762,751 A | * 6/1998 | Bleck et al. | 156/345 |
| 6,022,484 A | * 2/2000 | Bleck et al. | 216/67 |
| 6,024,630 A | * 2/2000 | Shendon et al. | 451/41 |
| 6,050,446 A | * 4/2000 | Lei et al. | 220/819 |
| 6,261,433 B1 | 7/2001 | Landau | 205/96 |
| 6,342,137 B1 | * 1/2002 | Woodruff et al. | 204/297.06 |

* cited by examiner

SEMICONDUCTOR PROCESSOR WITH WAFER FACE PROTECTION

CROSS-REFERENCE TO RELATED APPLICATIONS

The present application is a continuation application of U.S. patent application Ser. No. 09/046,808, filed Mar. 23, 1998, entitled SEMICONDUCTOR PROCESSOR WITH WAFER FACE PROTECTION, now U.S. Pat. No. 6,022,484, which is a divisional of U.S. patent application Ser. No. 08/516,175, filed Aug. 17, 1995, which issued as U.S. Pat. No. 5,762,751.

TECHNICAL FIELD

The technical field of this invention is semiconductor processing which provides face protection for the semiconductor wafers or other semiconductor pieces being processed.

BACKGROUND OF THE INVENTION

In the processing of semiconductor wafers and other semiconductor pieces it is frequently necessary to expose surfaces of the semiconductor piece to chemicals. The chemicals can be reactants, coatings or solvents. In some processes the chemical activity is preferably limited to one side of the wafer or other semiconductor piece being processed. Limiting chemical activity to one side of a wafer is desirable in many liquid spray processes. Limiting chemical activity to one side of a wafer is particularly desirable when the chemical processing involves gas reactants which easily migrate to all exposed surfaces of the wafer being processed.

Limiting the activity of processing chemicals is also desirable to reduce the quantity of chemicals which are consumed. Unnecessarily processing the back surface of a wafer consumes increased chemicals. Processing unnecessary surfaces also increases the quantities of residual or spent chemicals which are costly to treat or cause a disposal problem.

In one semiconductor process in particular it is desirable to prevent back face processing from occurring during at least one of the processing steps. This particular process is in the context of preparing semiconductor substrates for epitaxial layer growth. Formation of the epitaxial layers is susceptible to contamination from minute amounts of materials which can emanate from the back face of the substrate upon which the epitaxial layer is being formed.

In preparing the substrate for growth of the epitaxial layer it is necessary to remove all pre-existing oxide from the surface on which the epitaxial layer is being developed. This is typically done by etching with aqueous hydrogen fluoride or vaporous aqueous hydrogen fluoride. In the past, the back side of the wafer has been protected by a polymer layer. The polymer layer required additional processing to remove the layer before epitaxial development is performed. The current invention addresses this need by allowing oxide to be removed from the face of the substrate, while allowing the native or other oxide layer on the back side of the substrate to be maintained. This reduces the risk that diffusion may occur from the back of the substrate which can lead to undesired materials being incorporated into the epitaxial layer.

In other processes it is a requirement that particular coatings or reactants not contact one side of a wafer because of contamination effects which result in subsequent processing.

Thus there is a need for improved techniques which limit semiconductor processing to protect a surface or surfaces against chemical exposure otherwise desired upon one or more other surfaces of the wafer or other semiconductor piece being processed. In the past there have not been adequate semiconductor wafer processing equipment which can provide acceptable wafer face protection, particularly when the processing involves controlled rotational motion of the wafer while in the processing chamber.

BRIEF DESCRIPTION OF THE DRAWINGS

Preferred embodiments of the invention are described below with reference to the accompanying drawings. The drawings are briefly described below.

FIG. 4 is a top view of the processing head shown in FIG. 2.

TABLE 1

Figure 1:
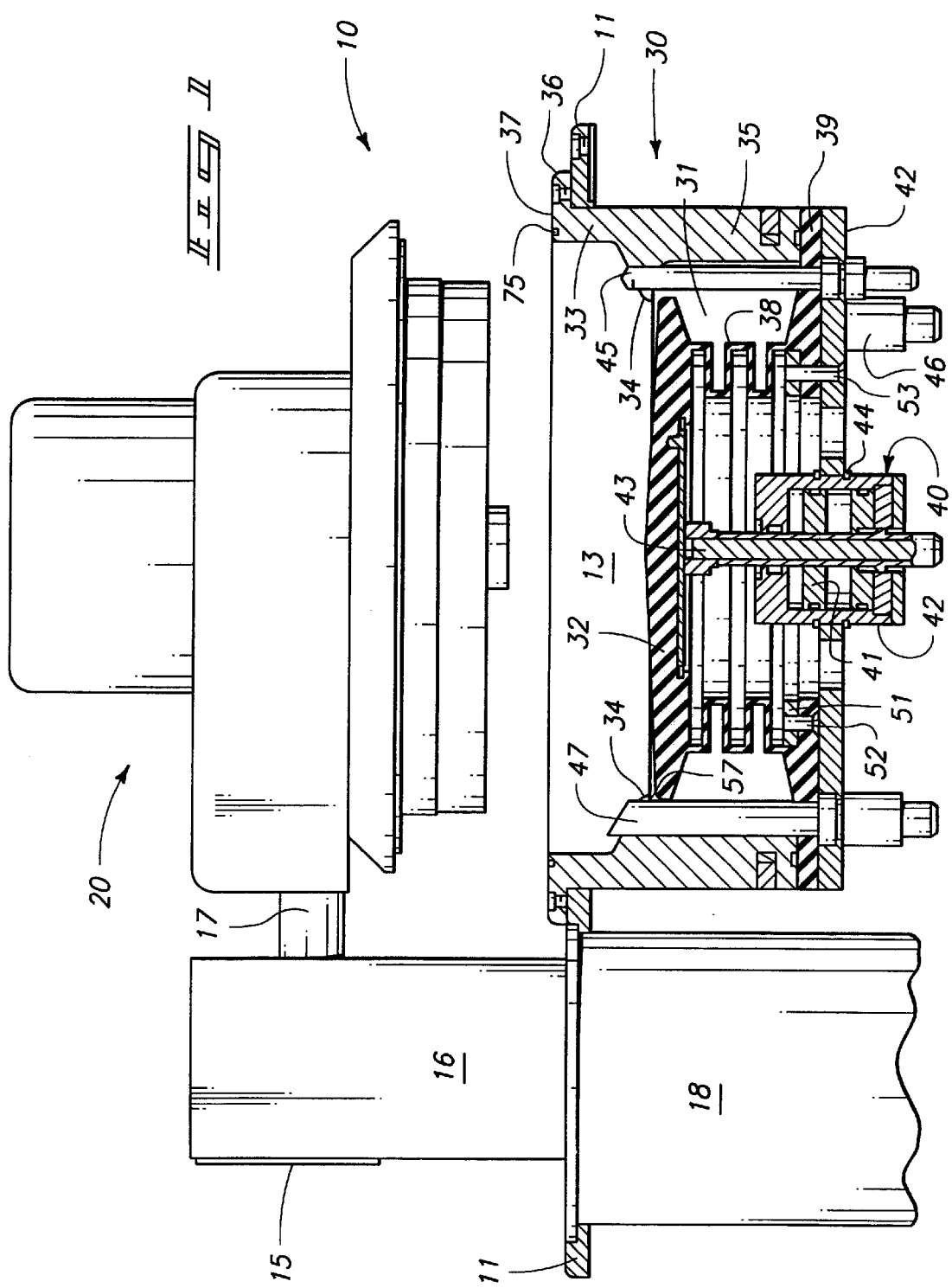
FIG. 1 is a side view, with portions shown in sectional presentation, of a preferred semiconductor processing station made in accordance with the invention. A processing head is shown in elevational view adjacent a complementary processing base which is shown in sectional view.

Listing of Subsections of Detailed Description and Pertinent Items with Reference Numerals and Page Numbers

| | |
|---|---|
| Semiconductor Processing Station Generally | 6 |
| processing station 10 | 6 |
| processing head 20 | 6 |
| processing base 30 | 6 |
| main processor deck 11 | 7 |
| processing head actuator 15 | 7 |
| central elevator column 16 | 7 |
| actuator base 18 | 7 |
| lateral output shaft 17 | 7 |
| main processing chamber 13 | 7 |
| Processing Station Base | 7 |
| processing station base 20 | 7 |
| main processing vessel or processing base bowl 33 | 8 |
| secondary or chemical chamber 31 | 8 |
| main processing chamber 13 | 8 |
| vapor control member 32 | 8 |
| sealing lip 57 | 8 |
| bowl sealing extension 34 | 8 |
| side wall 35 | 8 |
| bowl flange 36 | 8 |
| upper contact face 37 | 8 |
| bellows 38 | 8 |
| bellows base flange 39 | 8 |
| base bottom member 42 | 8 |
| an inner bellows bottom mounting ring 51 | 8 |
| mounting fasteners 53 | 8 |
| vapor control actuator 40 | 9 |
| piston 41 | 9 |
| cylinder 42 | 9 |
| retainer rings 44 | 9 |
| actuator shaft 43 | 9 |
| drying nozzle 45 | 9 |

TABLE 1-continued

Listing of Subsections of Detailed Description and
Pertinent Items with Reference Numerals and Page Numbers

| | |
|---|---|
| chemical chamber fitting 46 | 9 |
| processing chamber exhaust fitting 47 | 10 |
| Processing Head - Framework | 10 |
| head frame 61 | 10 |
| main head frame piece 62 | 10 |
| shaft mounts 63 | 10 |
| slide shafts 64 | 10 |
| fasteners 65 | 10 |
| rotor axis 66 | 10 |
| drive assembly 110 | 10 |
| fasteners: 67 | 10 |
| top cover 68 | 10 |
| medial cover 69 | 11 |
| processing vessel lid, door or closure 70 | 11 |
| wafer or similar semiconductor piece 100 | 11 |
| central lid aperture 71 | 11 |
| interior face 72 | 11 |
| exterior face 73 | 11 |
| annular contact zone 74 | 11 |
| processing chamber lid seal 75 | 11 |
| labyrinth seal grooves 78 | 12 |
| rotor labyrinth gas seal 80 | 12 |
| annular gas supply channel 81 | 12 |
| supply channel cover ring 84 | 12 |
| Processing Head - Wafer Holder | 12 |
| wafer or piece holder 130 | 12 |
| contact face 131 | 12 |
| annular grooves 132 | 12 |
| central holder aperture 133 | 12 |
| back face 101 | 12 |
| front face 102 | 12 |
| holder supply passageway 134 | 12 |
| tubular shaft 135 | 12 |
| vacuum supply plenum 136 | 12 |
| rotary seal assembly 137 | 12 |
| shaft flange 167 | 13 |
| Processing Head - Surface Cover | 14 |
| membrane cover 121 | 14 |
| Processing Head - Processing Chamber Rotor | 14 |
| rotating assembly 120 | 14 |
| processing chamber rotor 140 | 14 |
| cover support 150 | 15 |
| flexible membrane cover 121 | 15 |
| rotor support piece 151 | 15 |
| outer rotor piece 152 | 15 |
| inner rotor piece 153 | 15 |
| outer cover support projection 172 | 15 |
| inner cover support projection 173 | 15 |
| outer cover retainer 174 | 15 |
| inner cover retainer 175 | 15 |
| vacuum vent opening 198 | 16 |
| rotor drive wheel 154 | 16 |
| rotor hub 155 | 16 |
| rotor bearing 157 | 16 |
| spring member 168 | 16 |
| drive bushing 156 | 17 |
| splined shaft collar 161 | 17 |
| Processing Head - Drive Assembly | 17 |
| drive assembly 110 | 17 |
| slide shafts 64 | 17 |
| first or lower drive carriage 111 | 17 |
| second or upper drive carriage 112 | 17 |
| lower guide bushings 113 | 17 |
| upper guide bushings 114 | 18 |
| axial movement operator 200 | 18 |
| operator piston 201 | 18 |
| operator cylinder 202 | 18 |
| ports 209 | 18 |
| piston rod 203 | 18 |
| fastener 230 | 18 |
| cylinder end piece 204 | 18 |
| seals 205 and 206 | 18 |
| cylinder cover 207 | 18 |
| piston shaft seal 232 | 18 |
| retainer ring 208 | 18 |
| motor 210 | 19 |

TABLE 1-continued

Listing of Subsections of Detailed Description and
Pertinent Items with Reference Numerals and Page Numbers

| | |
|---|---|
| motor receptacle 211 | 19 |
| tubular motor shaft insert 213 | 19 |
| motor bearing 214 | 19 |
| motor bearing retainer ring 215 | 19 |
| rotary seal unit 137 | 19 |
| tachometer wheel 216 | 19 |
| spacer 217 | 19 |
| stop position cam wheel 218 | 19 |
| cam follower 220 | 19 |
| cam follower actuating unit 222 | 19 |
| Operation and Methods | 21 |
| Manner of Making | 25 |

\* \* \* (End of Table 1) \* \* \*

DETAILED DESCRIPTION OF THE PREFERRED EMBODIMENTS

This disclosure of the invention is submitted in furtherance of the constitutional purposes of the U.S. Patent Laws to promote the is progress of science and useful arts (Article 1, Section 8).

Semiconductor Processing Station Generally

FIG. 1 shows a preferred processing station 10 made in accordance with the invention. Processing station 10 includes a processing head 20 and a processing base 30. Processing base 30 is supported upon a main processor deck 11. Processing head 20 is advantageously supported relative to the processor deck 11 or other main framework of the processor using a processing head actuator 15. Processing head actuator 15 can be of various constructions. The preferred actuator shown is a simplified robotic mechanism having a central elevator column 16 which moves vertically within an actuator base 18. The actuator also has a lateral output shaft 17. Elevator shaft column 16 is used to controllably raise and lower the processing head 20. Lateral a output shaft 17 is controllably pivoted to place the processing head 20 into a face-down position as shown in FIG. 1, or a face-up position (not shown) which is approximately 180° of angular displacement relative to the face-down position shown.

FIG. 1 shows the processing head 20 spaced from processing base 30 and in vertically aligned position. Processing head 20 and base 30 are complementary so that head 20 can be lowered by actuator 15 downwardly until these two parts confine a main processing chamber 13 which is substantially enclosed when the head is lowered into an engaged position (not shown) with the processing base.

Processing Station Base

The processing station base 20 can be of various constructions dependent upon the type of processing which is to be performed in processing station 10. As shown, processing station 10 is designed to be used in vapor etching of silicon wafers using an aqueous mixture of hydrogen fluoride. The processing base includes a main processing vessel or processing base bowl 33. The aqueous mixture is held within a secondary or chemical chamber 31. Vapors emanate from a liquid mixture held in chamber 31 and are controllably released from chamber 31 into the main processing chamber 13 using a vapor control member 32. Vapor control member 32 forms the bottom wall of the main processing chamber 13. Vapor control member 32 seals against a sealing lip 57 which is formed upon a bowl sealing extension 34.

Base 30 also includes a side wall 35 which forms a part of bowl 33. At the upper reaches of side wall 35 is a bowl flange 36. Bowl flange 36 rests upon the main deck 11 which acts as the supporting main frame member. The upper contact face 37 of flange 36 is engaged by complementary surfaces of processing head 20.

Base 30 also advantageously includes a bellows 38 which includes a series of convolutions formed in a thin tubular member extending between the vapor control member 32 and a bellows base flange 39. Bellows base flange 39 is captured between the bottom edge of the bowl side wall 35 and a base bottom member 42. Bellows base flange 39 is also mounted using an inner bellows bottom mounting ring 51. Ring 51 is held to the bellows using fasteners 52. Ring 51 and the captured portion of the inwardly directed bellows bottom flange are also secured by mounting fasteners 53 which extend through and connect them with the base member 42. Base 42 is secured to the side wall 35 using fasteners (not shown).

The bowl 33, bellows 38, member 32 and other components of base 30 are advantageously made from polytetrafluoroethylene (PTFE), polyethylene, or other suitable materials depending on the chemicals being used.

FIG. 1 further shows a vapor control actuator 40 mounted between the vapor control member 32 and a base bottom member 42. Actuator 40 includes a piston 41 which is slidable within a cylinder 42. Cylinder 42 is mounted to base bottom member 42 using retainer rings 44. Piston 41 moves in response to a differential gas pressure applied on opposite sides of the piston. Piston 41 is connected to an actuator shaft 43. Actuator shaft 43 is connected to the underside of vapor control member 32 to allow controlled motion of the vapor control member. The vapor control member is movable into an extended, sealed position wherein the member seals against sealing extension 34 at seal 57. Vapor control member 32 is also movable into retracted positions wherein the member is spaced from sealing extension 34 to allow vapor migration from the chemical chamber 31 into main processing chamber 13. Bellows 38 flexes to allow such movement and protects actuator 40 from exposure to the corrosive aqueous hydrogen fluoride or other mixture contained in chamber 31.

Processing base 30 further includes a drying nozzle 45 which directs a jet of drying gas toward a wafer being processed in chamber 13. A chemical chamber fitting 46 is advantageously included to supply and/or drain chemicals from chamber 31. A processing chamber exhaust fitting 47 is advantageously provided to allow evacuation of processing gases and vapors from chamber 13 after a desired vapor processing period has been completed.

Although a particular base 30 has been described which is used for vapor phase processing, other bases are possible to allow gas or liquid chemical processing.

Processing Head—Framework

FIGS. 2–5 show the processing head 20 in greater detail. The processing head includes a framework which is generally referred to as head frame 61. Head frame 61 includes a main head frame piece 62 which is connected to the head operator output shaft 17 (shown only in FIG. 1) using shaft mounts 63. A pair or other suitable number of slide shafts 64 are connected by fasteners 65 to main head frame piece 62. The slide shafts are preferably parallel and oriented perpendicular to the main frame piece 62. Slide shafts 64 are also parallel with a rotor axis 66 about which a rotating assembly of the processing head rotates. The slide shafts act as part of the head framework and more significantly serve as guides upon which a drive assembly 110 is slidably mounted. The drive assembly and related components are described more fully below.

The upper ends of slide shafts 64 are advantageously tapped to receive fasteners 67 which secure a top cover 68 thereto. Processing head 20 also preferably includes a medial cover 69 which is secured to the main frame piece 62 using fasteners (not shown).

The main head frame piece 62 also supports a processing vessel lid, door or closure 70 which is complementary with the processing bowl 33. Bowl 33 forms a processing vessel first or main part, and the vessel lid 70 substantially forms a second processing vessel part. When the first and second processing vessel parts are engaged in the intended complementary relationship, a processing vessel is formed which substantially encloses the main processing chamber 13 and the secondary chemical chamber 31. A wafer or similar semiconductor piece 100 is held by the processing head within the main processing chamber 13 for gas or liquid phase processing therein.

The processing vessel lid 70 is advantageously provided with a central lid aperture 71. The central lid aperture allows portions of the rotating assembly 120 to extend therethrough. The processing vessel lid 70 does not rotate with the rotating assembly.

Processing vessel lid 70 has an interior face 72 and an exterior face 73. The interior face 72 includes an annular contact zone 74 which projects from the interior face. The projecting contact zone 74 engages a processing chamber lid seal 75 (see FIG. 1) which is mounted in the upper contact face 37 of the processing bowl flange 36. Seal 75 can advantageously be an O-ring or other suitable seal. Seal 75 is by the contact zone 74 to substantially seal the processing chamber 13.

Processing vessel lid 70 also preferably has a series of labyrinth seal grooves 78 which work in concert with portions of a rotor 140 to form a rotor labyrinth gas seal 80. Pressurized gas is fed to seal 80 using an annular gas supply channel 81. A supply channel cover ring 84 covers the gas supply channel 81. Small passageways extend between channel 81 and various points of the gas seal. Alternatively, the seal can be operated using vacuum instead of pressurized gas.

Processing Head—Wafer Holder

The rotating assembly 120 includes a suitable wafer or piece holder 130. The preferred wafer holder 130 includes a contact face 131 which is preferably provided with a series of annular grooves 132. Grooves 132 are supplied with vacuum pressure by connecting passageways (not shown) which convey vacuum to the grooves from a is central holder aperture 133. The contact face causes vacuum pressures to be developed upon a holder contact zone against the back face 101 of wafer 100. Because of the relatively greater (preferably atmospheric) pressure applied to the front face 102 of wafer 100, the wafer is held against the contact face 131 of piece holder 130.

Central aperture 133 is supplied with vacuum via a holder supply passageway 134 which is advantageously formed by a tubular shaft 135. The upper end of tubular shaft 135 is open to a vacuum supply plenum 136. Vacuum supply plenum 136 is formed within a rotary seal assembly 137 which allows the tubular shaft to rotate along with other parts of the rotating assembly. The rotary seal assembly provides sealing between rotatable and non-rotatable parts to maintain suitable vacuum pressures within vacuum supply plenum 136. The degree of vacuum needed will vary dependent upon the specific construction of the contact face 131 and the weight of the wafer or other semiconductor piece 100 being held.

The piece holder 130 is connected to shaft 135 via a shaft flange 167 welded or otherwise affixed to the end of the shaft. Flange 167 is received within a flange receptacle formed in the upper end of holder 130. A detachable retainer ring detachably connects the holder to the flange and shaft.

The outside of piece 130 is preferably provided with a bellows 169. The top of bellows 169 is held between an inner cover support piece 153 and rotor support piece 151. The lower end of bellows 169 is positioned about the holder piece 130.

Figure 2:
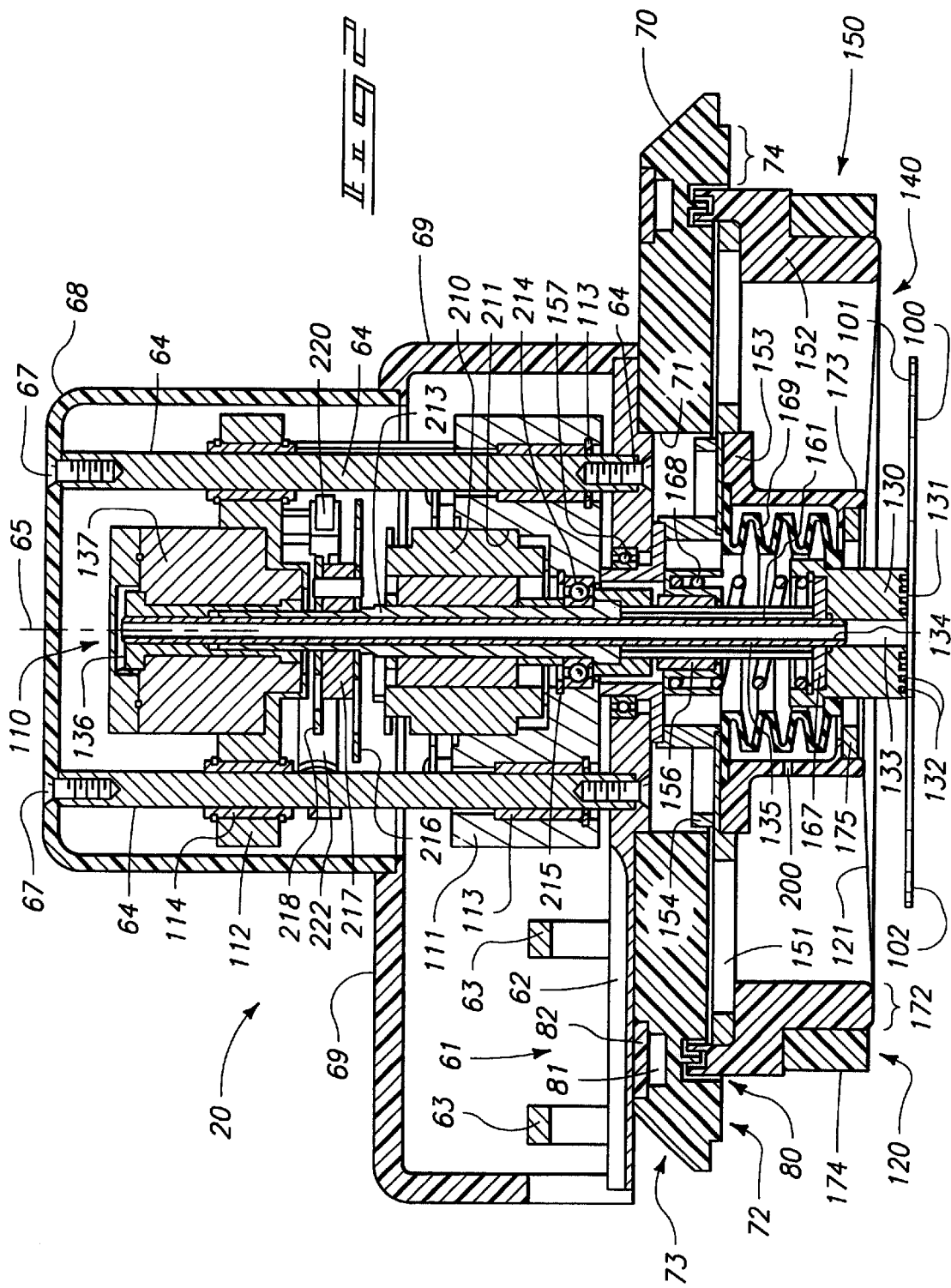
FIG. 2 is an enlarged sectional view showing the processing head portion illustrated in FIG. 1. A piece holder which forms part of the processing head is shown in an extended position holding a semiconductor wafer.
Figure 3:
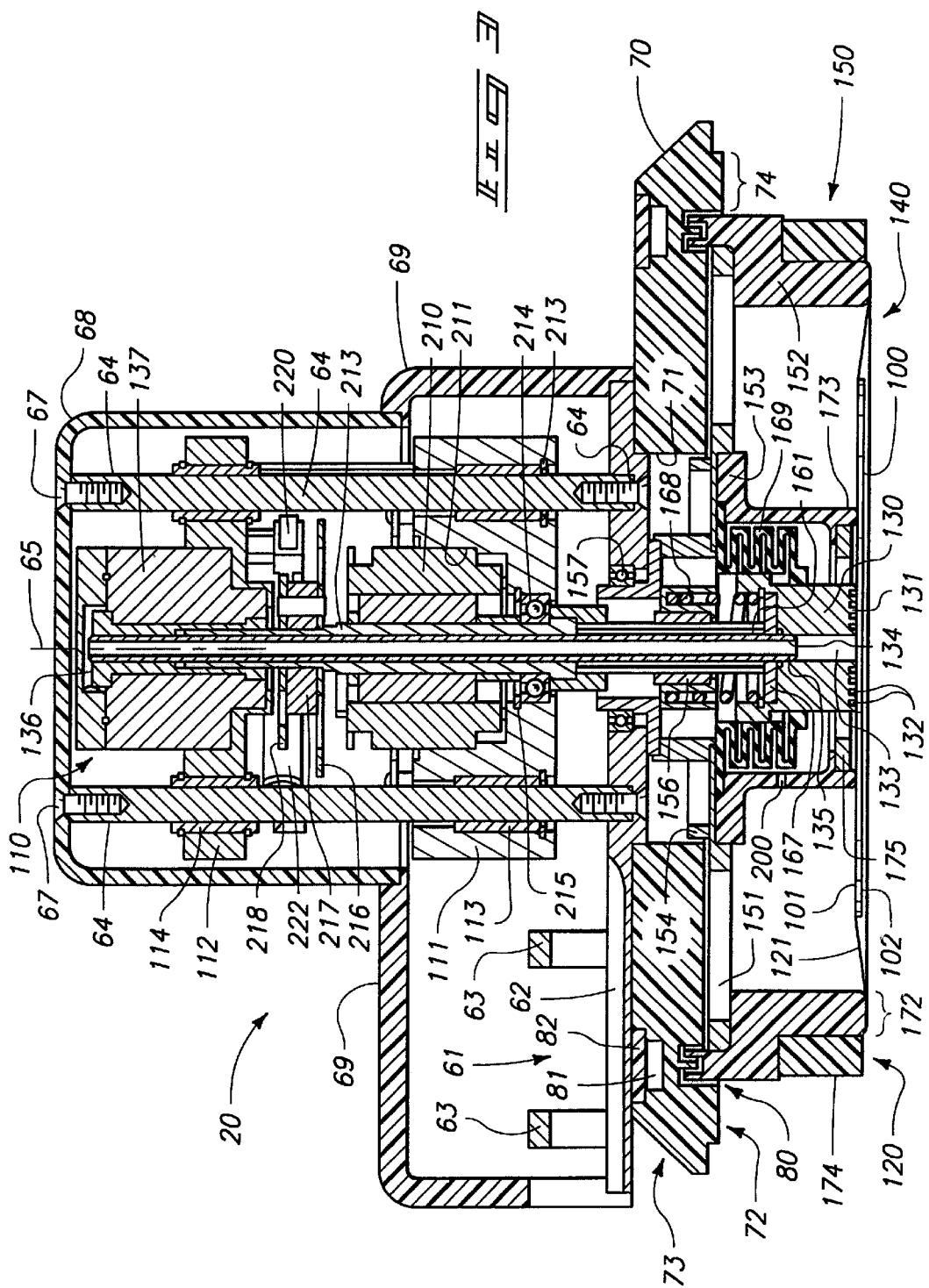
FIG. 3 is an enlarged sectional view similar to FIG. 2 with the piece holder in a retracted position which covers and protects the back surface of the wafer.
Figure 11:
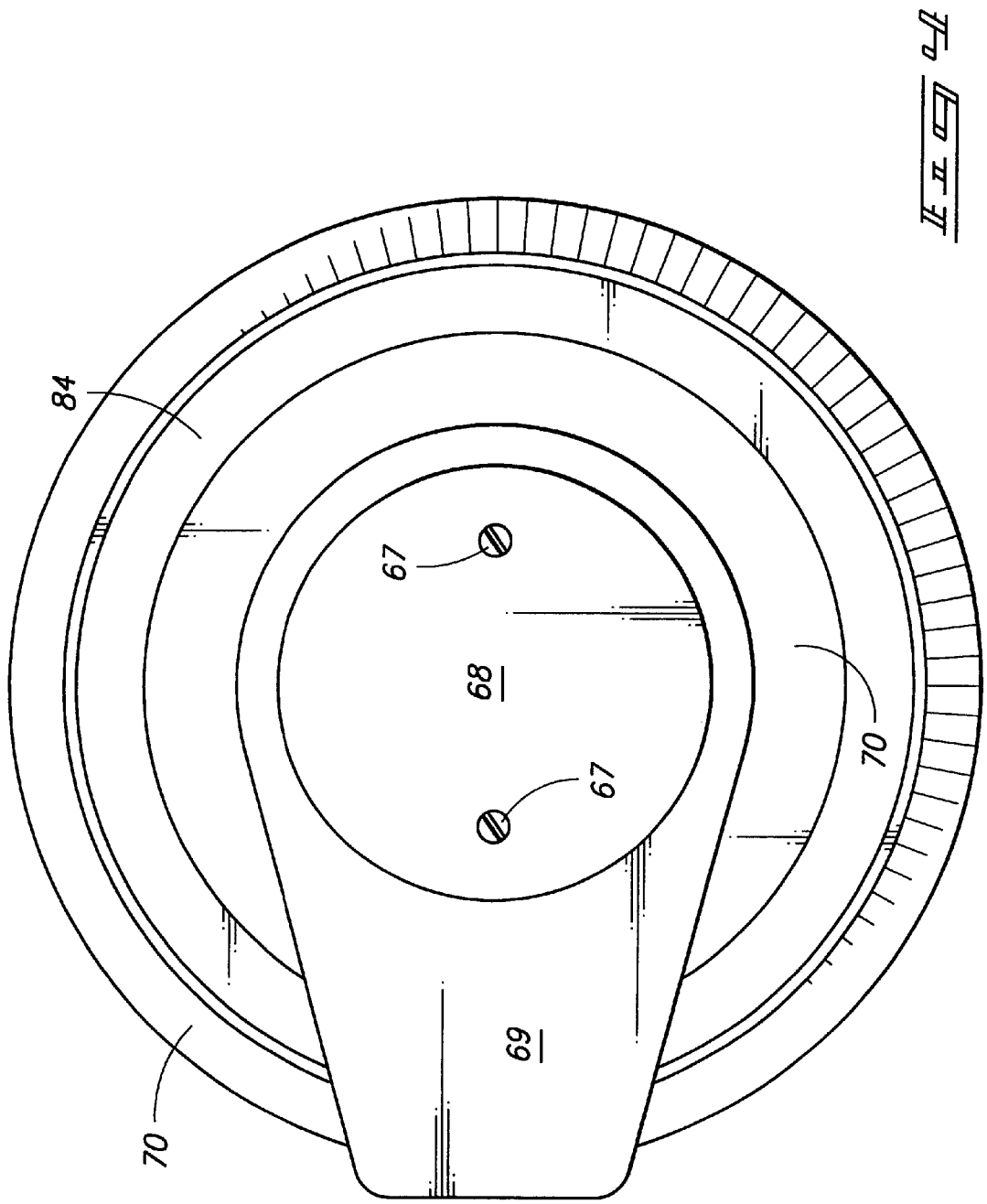
Figure 5:
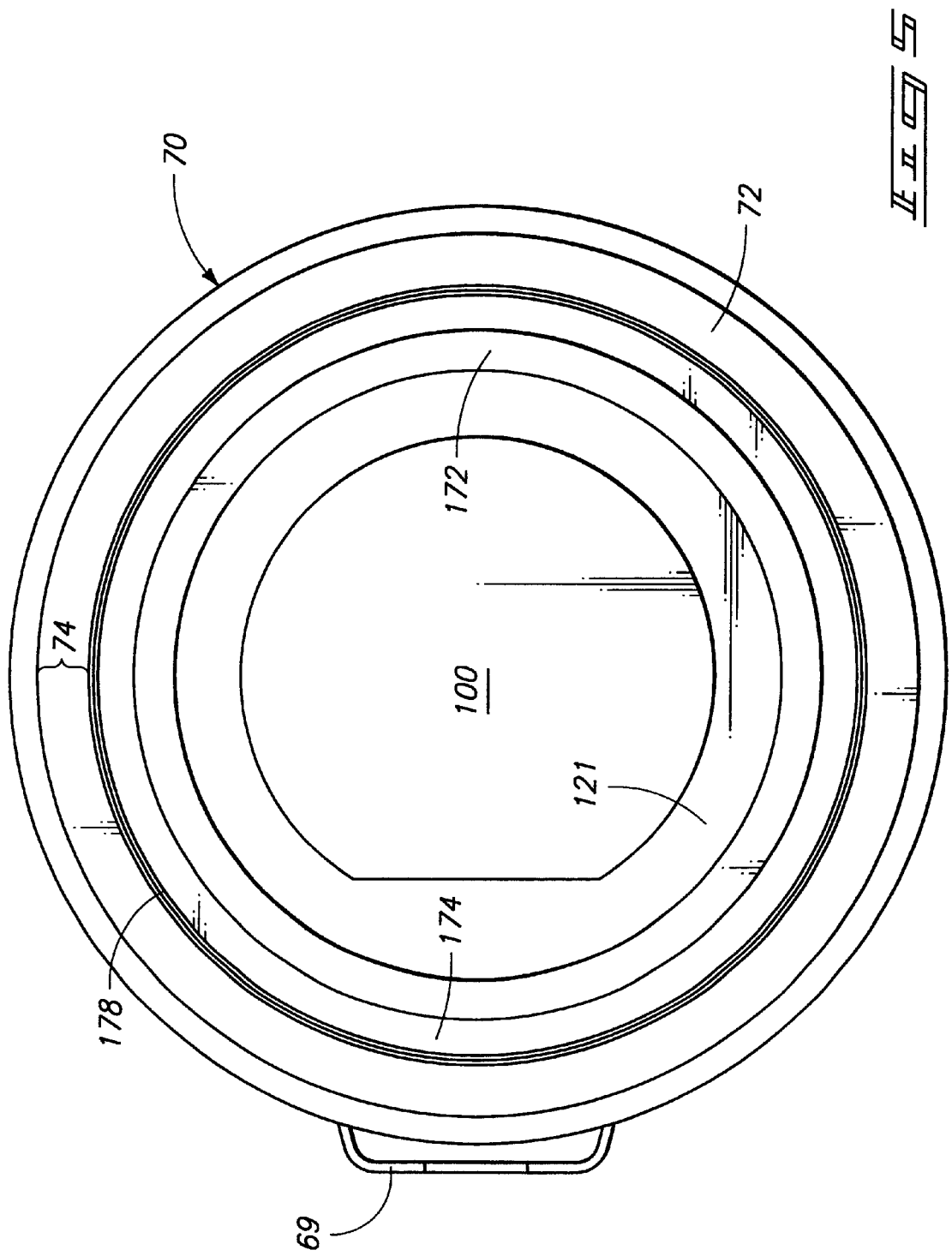
FIG. 5 is a bottom view of the processing head shown in FIG. 2.

FIGS. 2 and 3 illustrate that wafer holder 130 can be moved axially relative to other portions of the rotating assembly which do not move axially. This allows the wafer holder and supported wafer to be positioned into an extended position, such as shown in FIG. 2. In this position the supported wafer 100 is spaced free from a flexible membrane cover 121. FIG. 3 shows the wafer holder and supported wafer retracted into a retracted position. In this retracted position the periphery of the disk-shaped wafer back face is in contact with membrane cover 121.

Processing Head—Surface Cover

The membrane cover 121 covers the back face to prevent undesirable chemical action or contamination from occurring. Cover 121 also forms a cover seal which in this construction is a peripheral annular seal about the edge and adjacent back surface of wafer 100.

Cover 121 is preferably a flexible membrane. The flexible membrane is suspended between two parts of a cover support 150 which is further described below. The preferred flexible membrane cover is advantageously made from a plastic film, such as polytetrafluoroethylene (PTFE), TEFLON fluoropolymer, polyvinylidine fluoride, or other suitable materials. The membrane is preferably about 0.02–1 millimeters thick, more preferably 0.1–0.5 millimeters thick.

Processing Head—Processing Chamber Rotor

The processor head includes a rotating assembly 120 mentioned above. This rotating assembly includes rotating components which form portions of the drive assembly 110, and also rotating components which extend into the processing vessel. The rotating components which extend into the processing vessel are herein referred to as the processing chamber rotor 140. The processing chamber rotor includes portions of the wafer holder 130. The wafer holder 130 is axially movable, Rotor 140 also has parts which are not moved axially when the wafer holder moves between extended and retracted axial positions.

The axially stationary portions of rotor 140 include a cover support 150. Cover support 150 serves to support the flexible membrane cover 121. The cover support includes a rotor support piece 151 which is advantageously in the form of a spoked wheel. Rotor support piece 151 is connected to an outer rotor piece 152 and an inner rotor piece 153. Inner and outer rotor pieces are annular members which are securely connected to the rotor support piece, such as by using fasteners (not shown).

The outer cover support piece 152 has an outer cover support projection 172. Similarly, the inner cover support piece 153 has an inner cover support projection 173. An outer cover retainer 174 is provided in the form of a ring which extends about the support projection 172. The outer periphery of the membrane cover 121 is captured between the outer face of projection 172 and the inner surface of retaining ring 174. The inner margin of the membrane cover 121 is similarly captured between the inner cover support projection 173 and an inner cover retainer 175. Inner retainer 175 is also preferably in the form of a ring member.

The membrane-contacting faces of projections 172 and 173 are preferably positioned at different axial positions. This is advantageously done so that the flexible membrane 121 forms a flattened truncated conical shape which converges inwardly. Preferred angles of inclination for the cone are in the range of 0–10° of arc, as defined by the angle of the exposed membrane surface relative to a plane perpendicular to the rotor axis 65. The contacting portions of projections 172 and 173 are also preferably provided with curved edges to reduce stresses and the risk of tearing the membrane.

The inner cover support piece 153 is also preferably provided with a vacuum vent opening 198. Vent opening 198 relieves vacuum pressures which would otherwise be developed along the back face of wafer 100 when the wafer comes into sealing engagement with the membrane 121. The holder 130 most preferably uses vacuums on the order of 800–900 millibars within chamber 133, so that forces developed across the back of the wafer are sufficient to need relief when sealing occurs. Alternative operational parameters may eliminate the need for vent 198.

The processing chamber rotor 140 is mounted for rotation relative to the head frame. The rotor support piece 151 is connected to a rotor drive wheel 154, using suitable fasteners (not shown). The rotor drive wheel is connected to a rotor hub 155. Hub 155 is rotatably supported by a rotor bearing 157. Bearing 157 is mounted within a central aperture formed through main head frame piece 62. Hub 155 is retained to the inner race of bearing 157 with biasing force provided by a spring 168.

Rotor drive wheel 154 also has an annular receptacle which receives spring member 168 therein. The spring is advantageously a helical spring. The spring member 168 serves as an axial biasing member acting between member 154 and piece holder 130.

To transfer torque to rotor 140, the rotor drive wheel 154 is also securely connected to a drive bushing 156. Drive bushing 156 is positioned about the drive shaft formed by tubular member 135. The drive bushing 156 has interior splines which inter-engage with exterior splines formed upon a splined shaft collar 161. Collar 161 is shrink-fit or otherwise non-rotatably connected to tubular drive shaft 135. The splined engagement between shaft collar 161 and splined drive bushing 156 is capable of transmitting torque while also allowing relative axial movement to occur between these parts. The splined shaft collar 161 slides upwardly and downwardly in response to controlled axial (vertical) positioning of the drive assembly. The rotor assembly formed by rotor parts 151–56 is rotatable but not capable of significant axial motion. The rotor assembly is instead held in a relatively fixed axial position by bearing 157. The drive assembly and attached wafer holder 130 thus form an axially movable assembly which allows adjustable axial spacing between the wafer 100 and the flexible membrane cover 121.

Processing Head—Drive Assembly

Processing head 20 includes a drive assembly 110. Drive assembly 110 is slidably mounted upon the slide shafts 64 to allow axial (vertical) movement of the drive and attached wafer holder 130. Drive assembly 110 includes a first or lower drive carriage 111 and a second or upper drive carriage 112. The lower drive carriage is preferably fitted with two lower guide bushings 113 through which the slide shafts extend. Similarly, the upper drive carriage is preferably fitted with two upper guide bushings 114. Bushings 113 and 114 are preferably secured to the carriages, such as by using detachable retainer rings as shown.

Figure 6:
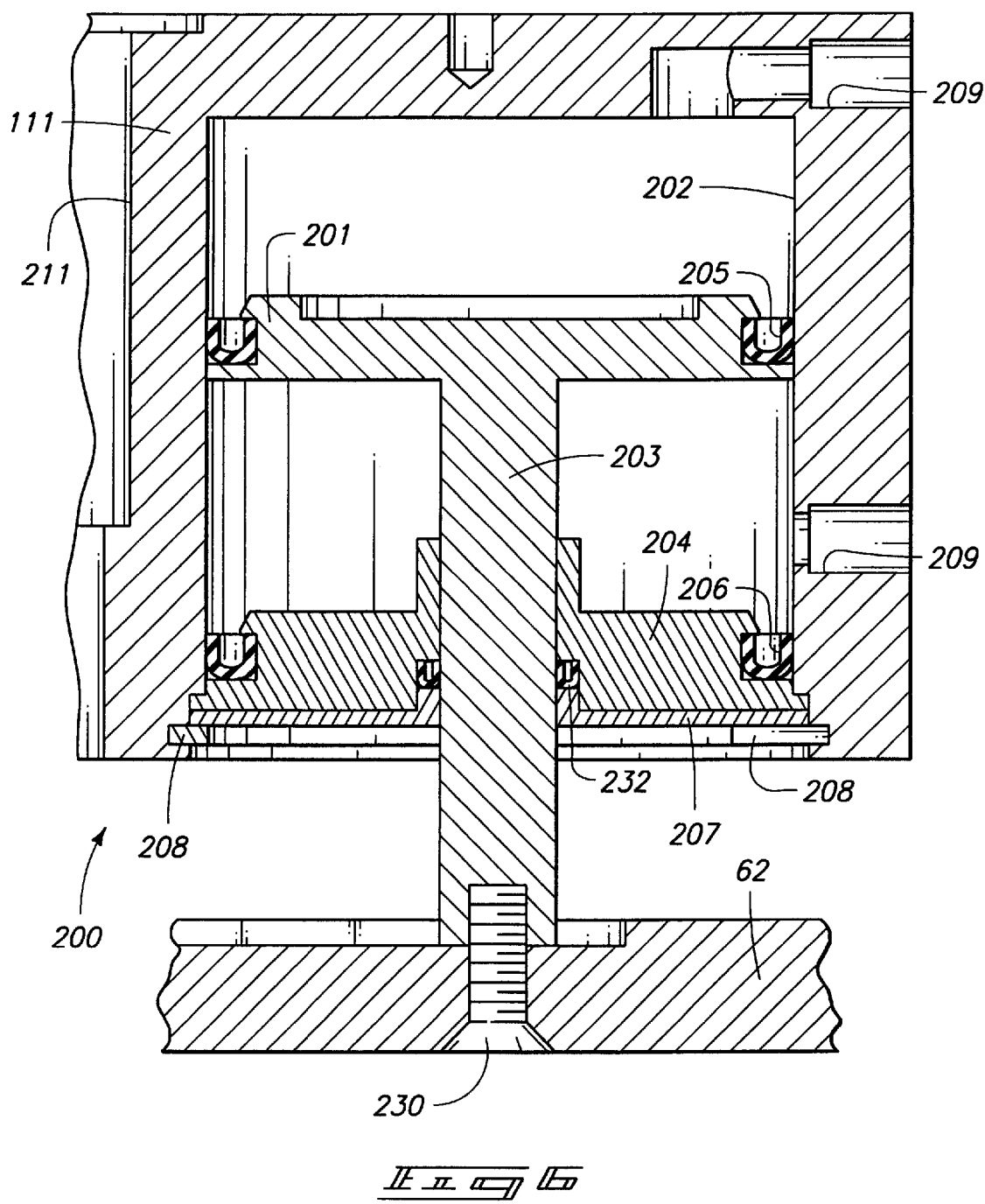
FIG. 6 is an enlarged longitudinal sectional view showing a preferred axial movement operator used in the processing head of FIG. 2.

The drive assembly is controllably moved upwardly and downwardly by a suitable axial movement operator. FIG. 6 shows a preferred construction of axial movement operator 200 in greater detail. In the preferred form of processing head 20, there are four operators 200 at spaced angular positions within the lower drive carriage 111.

Each operator 200 includes an operator piston 201 which is slidably received within a operator cylinder 202 formed in the lower carriage 111. A differential fluid pressure is applied across the operator piston to move the lower carriage 111 either upwardly or downwardly as desired. Pressure and/or vacuum are communicated to the operator via ports 209.

Piston 201 is connected to a piston rod 203 which is secured to the head frame piece 62, such as by a fastener 230. The piston rod is received through a cylinder end piece 204 mounted in the lower end of the cylinder 202. The assembly also preferably includes seals 205 and 206 which seal with the cylinder to help maintain operating pressures in the appropriate compartments of the cylinder as divided by the piston. A cylinder cover 207 is adjacent to the cylinder end piece 204 to support the end piece and hold it in position. Cylinder cover 207 also supports a piston shaft seal 232. The cylinder cover 207 is held by a retainer ring 208.

Drive assembly 110 also includes a motor 210. Motor 210 can be of various constructions but is preferably a brushless DC electrical motor. Motor 210 is mounted within a motor receptacle 211 formed in the lower carriage 111. The output of motor 210 is a hollow internal shaft which receives a tubular motor shaft insert 213. Shaft insert 213 also functions as a bearing support for engaging with the inner race of motor bearing 214. The outer race of bearing 214 is held in the lower carriage 111 and is retained against a shoulder in the motor receptacle using a detachable motor bearing retainer ring 215.

The upper end of tubular motor shaft insert 213 extends into and is sealed by the rotary seal unit 137. Upper portions of shaft 213 further serve to mount a tachometer wheel 216, spacer 217, and stop position cam wheel 218. Tachometer wheel 216 is detected by an optical detector (not illustrated) to provide wheel speed and angular position information used in controlling the rotor drive. Stop position cam wheel 218 is engaged by a cam follower 220 during the process of stopping the rotor. By utilizing an irregular shaped cam having a singular low point, the rotor can be stopped in a predetermined singular stop position which aids in loading and unloading the processing head in a reliable manner. The cam follower is extended by a cam follower actuating unit 222, which is advantageously a small pneumatic piston mounted to pivot the cam follower into engagement with the cam wheel 218. The preferred construction of the tachometer and stop positioner are generally similar to the processing head construction shown in U.S. Pat. No. 5,431,421 issued Jul. 11, 1995 which is hereby incorporated by reference.

Operation and Methods

The invention further includes novel methods which will further be explained in the context of operation of the preferred processing station 10 described herein. The processes preferably involve loading a wafer 100 or other semiconductor piece onto the piece holder 130. This is preferably accomplished with the processing head 20 in a face-up position with the rotor upward. The positioning of the processing head is advantageously accomplished by moving the processing head actuator 15 into an extended position and pivoting the lateral output shaft 17 so that the rotor is face-up. The loading typically involves positioning the wafer or other semiconductor piece 100 adjacent to the contact face 131 of piece holder 130.

The methods also preferably involve holding the semiconductor piece on the holder. As shown, this is preferably accomplished by drawing a vacuum across at least portions of the contact face 131 and creating a holding force which is effectively upon the back surface 101 of the wafer.

The methods and operation further preferably include retracting the piece holder 130 and semiconductor piece 100 relative to the flexible membrane surface cover 121. This retracting step causes the wafer to move into the position shown in FIG. 3. Sufficient retracting causes the flexible membrane surface cover to act by covering at least one surface of the semiconductor piece, such as the back face 101 of wafer 100. The retracting also preferably includes deflecting the flexible membrane 121 and sealing between the covered surface and the cover. In the configuration shown, the deflecting and sealing actions are advantageously performed about the periphery of the wafer to effect a continuous sealing line at or near the peripheral edge of the wafer.

The methods of this invention also preferably include engaging the processing head 20 with the processing base 30 into complementary relationship, thereby forming a substantially enclosed processing chamber 13. The engaging and forming of the substantially enclosed processing chamber are preferably conducted after the retracting and sealing steps explained above. Alternatively, it is possible to form the process chamber and then retract and preferably seal the piece 100 to the cover 121.

Methods according to this invention further advantageously include exposing the semiconductor piece to process conditions to effect at least one processing step upon a surface of the semiconductor piece not covered by the surface cover 121. This exposing step can advantageously include retracting the vapor control member 32 to allow processing vapors to flow from the chemical chamber 31 into the main processing chamber 13 to effect the exposing step. Alternatively, exposing steps such as spraying with liquids, jetting with gases, and other con figurations and processes are possible.

The exposing or treating step or steps just described are preferably carried out while simultaneously rotating the rotor 140 and supported wafer 100. The back side of the wafer is protected by cover 121. The rotation is preferably performed at rotor angular speeds in the range of 10–3000 revolutions per minute, more preferably 100–1000 revolutions per minute, even more preferably 100–500 revolutions per minute.

In some processes according to the invention the processing next involves stopping the exposing or treating step. This is advantageously done by removing the active chemical or chemicals from contact with the exposed surface or surfaces of the wafer. In the embodiment shown the exposed front face 102 can be freed from further reaction by closing the vapor control member 32 and evacuating the reactant gas from within the main processing chamber 13. Evacuating can occur via the exhaust fitting 47.

The novel methods also preferably include extending the piece holder 130 and held semiconductor piece 100 relative to the flexible membrane surface cover 121. This retracting step causes the wafer to move into the extended position shown in FIG. 2, or other suitable extended position wherein the wafer or other piece is spaced from the membrane 121. This also performs an uncovering function which uncovers the back face of wafer 100.

The extending step can be combined with continued rotation of the rotor to perform a slinging step which removes any excess water or other processing chemicals or resulting products from the lower, front side 102 of the wafer. The combined rotation and separation of the wafer from cover 121 prevents capillary action from drawing liquids from the peripheral edge or face of the wafer onto the back side 101.

After the treating and rotating steps, the rotor is preferably brought to rest by stopping the rotating assembly. This is preferably done by controlling the motor 210 to perform a braking function. When the rotating assembly speed is sufficiently slow, the stop positioner actuator 222 is operated to extend cam follower 220 against cam 218 and bring the rotor into a desired stop position in preparation for unloading.

The methods of this invention still further preferably include disengaging the processing head 20 from the processing base 30. The disengaging can be conducted before the extending step explained above. More preferably, it is typical to disengage the processing head from the processing base after the extending step. The disengaging step is preferably accomplished by extending the processing head from the processing bowl, such as by extending the central elevator column 16 of processing head actuator 15. The processing head is then preferably reoriented by pivoting the lateral output shaft 17 to bring the processing head into a face-up orientation.

The methods can further include unloading the semiconductor piece from the piece holder. This is best accomplished by engaging the back surface of the semiconductor piece with a wafer transfer and lifting mechanism (not shown). Prior to unloading the wafer from the processing head 20, the vacuum used to hold the wafer onto the holder 130 is stopped or otherwise reduced to perform a releasing action.

Manner of Making

The semiconductor processing station described herein can be made using typical machining and fabricating techniques. The materials of construction will vary dependent upon the types of chemicals which are to be used in the processing chamber 13 and chemical chamber 31. Exemplary plastic materials for the processing vessel and cover are listed above. Materials not directly exposed to the processing chemicals may advantageously be fabricated from a variety of materials. Parts subjected to mechanical actions will in general be made from a suitable aluminum with a suitable coating, such- as an anodized aluminum oxide layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An apparatus for processing a semiconductor workpiece having a front face and a back face, comprising:

a bowl configured to contain a processing fluid for processing the front face of the workpiece; and a processing head over the bowl, the processing head being configured to hold the front face of the workpiece downward to face the bowl, and the processing head comprising a member configured to contact the back face of the workpiece, the member including at least one vacuum opening coupleable to a vacuum source and positioned to draw the workpiece against the member, and a seal configured to contact a peripheral portion of the workpiece, and inhibits the processing fluid from contacting at least the peripheral portion of the workpiece.

2. The apparatus of claim 1 wherein the seal is positioned to contact a peripheral corner of the workpiece.

3. The apparatus of claim 1 wherein the seal is flexible.

4. The apparatus of claim 1 wherein the processing head is positioned to hold the front face of the workpiece in contact with a processing fluid when the bowl contains the processing fluid.

5. The apparatus of claim 1 wherein the processing head is movable toward and away from the bowl.

6. The apparatus of claim 1 wherein the processing head is rotatable relative to the bowl.

7. The apparatus of claim 1, further comprising a source of the processing fluid coupled to the bowl.

* * * * *

UNITED STATES PATENT AND TRADEMARK OFFICE
CERTIFICATE OF CORRECTION

PATENT NO. : 6,746,565 B1
DATED : June 8, 2004
INVENTOR(S) : Martin C. Bleck et al.

It is certified that error appears in the above-identified patent and that said Letters Patent is hereby corrected as shown below:

Title page,
Item [75], Inventors, please add "Thomas H. Oberlitner, Kallispell, MT";

Column 4,
Line 38, delete "a" between "lateral" and "output";

Column 6,
Line 29, insert -- engaged -- between "is" and "by";
Line 46, delete "is" between "a" and "central";

Column 8,
Line 46, "151-56" should be -- 151-156 --.

Signed and Sealed this

Eighteenth Day of January, 2005

JON W. DUDAS
*Director of the United States Patent and Trademark Office*